(12) United States Patent
Frank

(10) Patent No.: US 10,790,818 B1
(45) Date of Patent: Sep. 29, 2020

(54) SLEW RATE CONTROL BY ADAPTATION OF THE GATE DRIVE VOLTAGE OF A POWER TRANSISTOR

(71) Applicant: Infineon Technologies Austria AG, Villach (AT)

(72) Inventor: Wolfgang Frank, Augsburg (DE)

(73) Assignee: Infineon Technologies Austria AG (AT)

( * ) Notice: Subject to any disclaimer, the term of this patent is extended or adjusted under 35 U.S.C. 154(b) by 0 days.

(21) Appl. No.: 16/585,676

(22) Filed: Sep. 27, 2019

(51) Int. Cl.
*H03K 3/00* (2006.01)
*H03K 4/00* (2006.01)
*H03K 17/00* (2006.01)
*H03K 17/687* (2006.01)
*H03K 17/06* (2006.01)
*H03K 17/16* (2006.01)

(52) U.S. Cl.
CPC ........... *H03K 17/687* (2013.01); *H03K 17/06* (2013.01); *H03K 17/161* (2013.01)

(58) Field of Classification Search
CPC ..... H03K 17/687; H03K 17/161; H03K 17/06
See application file for complete search history.

(56) References Cited

U.S. PATENT DOCUMENTS

| 5,625,312 A * | 4/1997 | Kawakami | G02B 6/42 |
| | | | 327/483 |
| 5,828,247 A * | 10/1998 | Moller | H03K 17/0822 |
| | | | 327/110 |
| 5,986,484 A * | 11/1999 | Kimata | H03K 17/0828 |
| | | | 323/908 |
| 6,545,513 B2 * | 4/2003 | Tsuchida | H03K 4/94 |
| | | | 323/274 |
| 6,625,516 B2 * | 9/2003 | Niimi | H03K 17/6257 |
| | | | 327/108 |
| 6,906,574 B2 * | 6/2005 | Ohi | H03K 17/08128 |
| | | | 327/392 |
| 7,292,088 B2 | 11/2007 | Jeong | |
| 7,336,119 B2 | 2/2008 | Jeong | |
| 7,737,761 B2 * | 6/2010 | Ishikawa | H03K 17/567 |
| | | | 327/170 |
| 7,948,277 B2 * | 5/2011 | Nakatake | H03K 17/08128 |
| | | | 327/109 |
| 8,427,207 B2 * | 4/2013 | Deboy | H01L 29/7803 |
| | | | 327/108 |
| 8,773,172 B2 * | 7/2014 | Bayerer | H03K 17/063 |
| | | | 327/108 |

(Continued)

*Primary Examiner* — Kenneth B Wells
(74) *Attorney, Agent, or Firm* — Design IP

(57) ABSTRACT

A gate driver circuit includes a first power supply rail providing a first fixed supply voltage; a second power supply rail providing a second fixed supply voltage; a transistor including a gate terminal having a gate voltage; and a gate driver integrated circuit (IC) supplied with the first fixed supply voltage and the second fixed supply voltage, the gate driver IC including an output terminal configured to provide a gate drive voltage at the output terminal in order to drive the transistor between switching states. The gate driver IC includes a first voltage converter configured to modulate an amplitude of the first fixed supply voltage to generate a first modulated supply voltage; and a first switch configured to selectively couple the first fixed supply voltage and the first modulated supply voltage to the output terminal of the gate driver IC in order to regulate the gate drive voltage.

28 Claims, 8 Drawing Sheets

(56) References Cited

U.S. PATENT DOCUMENTS

| | | | |
|---|---|---|---|
| 10,211,824 B2 * | 2/2019 | Tsurumaru | H02M 7/53875 |
| 10,374,599 B2 * | 8/2019 | Hokazono | H03K 17/284 |
| 2014/0361706 A1 | 12/2014 | Kulkarni et al. | |
| 2018/0034459 A1 | 2/2018 | Lee | |

* cited by examiner

SLEW RATE CONTROL BY ADAPTATION OF THE GATE DRIVE VOLTAGE OF A POWER TRANSISTOR

FIELD

The present disclosure relates generally to power transistors, and, more particularly, to controlling a gate drive voltage of a power transistor.

BACKGROUND

Many functions of modern devices in automotive, consumer and industrial applications, such as converting electrical energy and driving an electric motor or an electric machine, rely on power semiconductor devices. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device usually comprises a semiconductor structure configured to conduct a load current along a load current path between two load terminal structures of the device. Further, the load current path may be controlled by means of a control electrode, sometimes referred to as a gate electrode. For example, upon receiving a corresponding control signal from, e.g., a driver unit, the control electrode may set the power semiconductor device in one of a conducting state and a blocking state. A control signal may by a voltage signal or a current signal having a controlled value.

A power transistor is a power semiconductor device that may be used to drive a load current. There is a turn-on process and a turn-off process for switching the power transistor on and off. During the turn-on process, a gate driver integrated circuit (IC) is used to provide (source) a gate current to the gate of the power transistor in order to charge the gate. In contrast, during the turn-off process, the gate driver IC is used to draw (sink) a gate current from the gate of the power transistor in order to discharge the gate. The gate driver circuit can be an integrated circuit (IC).

The gate driver IC is supplied with a fixed positive voltage Vpos by a positive supply rail and a fixed negative voltage Vneg by a negative supply rail. These voltages cannot be changed during operation. A gate resistor Rg connects the output (OUT) terminal of the gate driver IC with the gate terminal of the power transistor. Therefore, the driving gate current Ig is also fixed following Ohm's law (Ig=(Vpos−Vneg)/Rg). This means that also the switching behavior of the power transistor is fixed for any operation varying over temperature or transistor current.

FIG. 1 illustrates, on the left, a dV/dt behavior in power switches, and, on the right, a schematic representation of an IGBT 1. In particular, FIG. 1 shows, on the left, a transient diagram of $V_{CE}$ (i.e., dV/dt) and $I_c$ (i.e., di/dt) during a turn-on switching event. The $V_{CE}$ voltage transient, called dV/dt, is initially very steep and fast and then, when charge at the gate-collector capacitance $C_{GC}$ becomes large, changes to having a shallow slope to finish with a long slow tail for the last few volts.

During the turn-on switching event, $V_{GE}$ increases as $C_{GC}$ is charged. Once $V_{GE}$ is equal to the threshold voltage Vth, current $I_c$ begins to flow. FIG. 1 further illustrates, on the right, a schematic diagram of a power transistor 1 showing the gate-collector (parasitic) capacitance $C_{GC}$, the collector-emitter voltage $V_{CE}$, the collector current Ic, and the gate-emitter voltage $V_{GE}$.

In standard planar technology, a fast dV/dt transient is present but is mitigated by the Miller effect on the gate-collector capacitance $C_{GC}$. In fact, a gate driver output current Ig, used to raise (i.e., charge) the gate voltage of the power transistor during the turn-on transient, fully flows into $C_{GC}$ during the dV/dt and the gate voltage appears flat or constant forming the "Miller plateau." The phase during the transition in which the gate voltage appears flat is referred to as the Miller phase. Following the Miller phase, the gate-emitter voltage $V_{GE}$ charges to the positive voltage Vpos.

All power transistors show during the transition of collector-emitter voltage (or drain-source voltage) and collector current (or drain current) a constant gate voltage. This is called the Miller voltage. The level of the Miller voltage is a function of the collector current or the drain current of the power transistor. The Miller voltage (gate-emitter voltage $V_{GE}$) increases with higher collector/drain current and the voltage difference across the gate resistor Rg decreases due to the fixed voltage at the output terminal of the gate driver IC. Therefore, the effective gate drive voltage across the gate resistor Rg, which drives the collector/drain current during the turn-on transient, is reducing with increasing collector/drain current. This yields larger turn-on energy (i.e., higher switching losses) at lower switching speeds.

Therefore, an improved device in which the supply voltage is no longer fixed, but adjustable, may be desirable in order to increase or decrease the gate current during the Miller phase of operation. The switching behavior of the power transistor could then be changed over the operating conditions of the power transistor and to compensate for the Miller effect.

SUMMARY

Systems, devices, and methods are provided herein for adapting control of a gate current of a power transistor based on an input capacitance of the power transistor.

According to one or more embodiments, a gate driver circuit is provided. The gate driver circuit includes a first power supply rail configured to provide a first fixed supply voltage; a second power supply rail configured to provide a second fixed supply voltage; a transistor including a gate terminal having a gate voltage; a gate driver integrated circuit (IC) supplied with the first fixed supply voltage and the second fixed supply voltage, the gate driver IC including an output terminal coupled to the gate terminal of the transistor and configured to provide a gate drive voltage at the output terminal in order to drive the transistor between switching states; and a gate resistor coupled between the output terminal of the gate driver IC and the gate terminal of the transistor, wherein the gate resistor defines a gate current based on the gate drive voltage and the gate voltage. The gate driver IC further includes: a first voltage converter configured to receive the first fixed supply voltage and modulate an amplitude of the first fixed supply voltage to generate a first modulated supply voltage; and a first switch configured to selectively couple the first fixed supply voltage and the first modulated supply voltage to the output terminal of the gate driver IC in order to regulate the gate drive voltage.

According to one or more embodiments, a method of driving a transistor between switching states in a power circuit is provided. The method includes supplying a gate drive voltage at an output terminal of a gate driver IC in order to drive the transistor between switching states; supplying a first fixed supply voltage and a second fixed supply voltage to the gate driver IC; converting, by the gate driver IC, the first fixed supply voltage into a first modulated supply voltage; and selectively coupling, by the gate driver IC via a first switch, the first fixed supply voltage and the first modulated supply voltage to the output terminal of the gate driver IC in order to regulate the gate drive voltage.

According to one or more embodiments, a gate driver includes a first terminal configured to receive a first fixed supply voltage; a second terminal configured to receive a second fixed supply voltage; an output terminal configured to provide a gate drive voltage in order to drive a transistor between switching states; a first voltage converter configured to receive the first fixed supply voltage and modulate an amplitude of the first fixed supply voltage to generate a first modulated supply voltage; and a first switch configured to selectively couple the first fixed supply voltage and the first modulated supply voltage to the output terminal in order to regulate the gate drive voltage.

BRIEF DESCRIPTION OF THE DRAWINGS

Embodiments are described herein making reference to the appended drawings.

DETAILED DESCRIPTION

Figure 1:
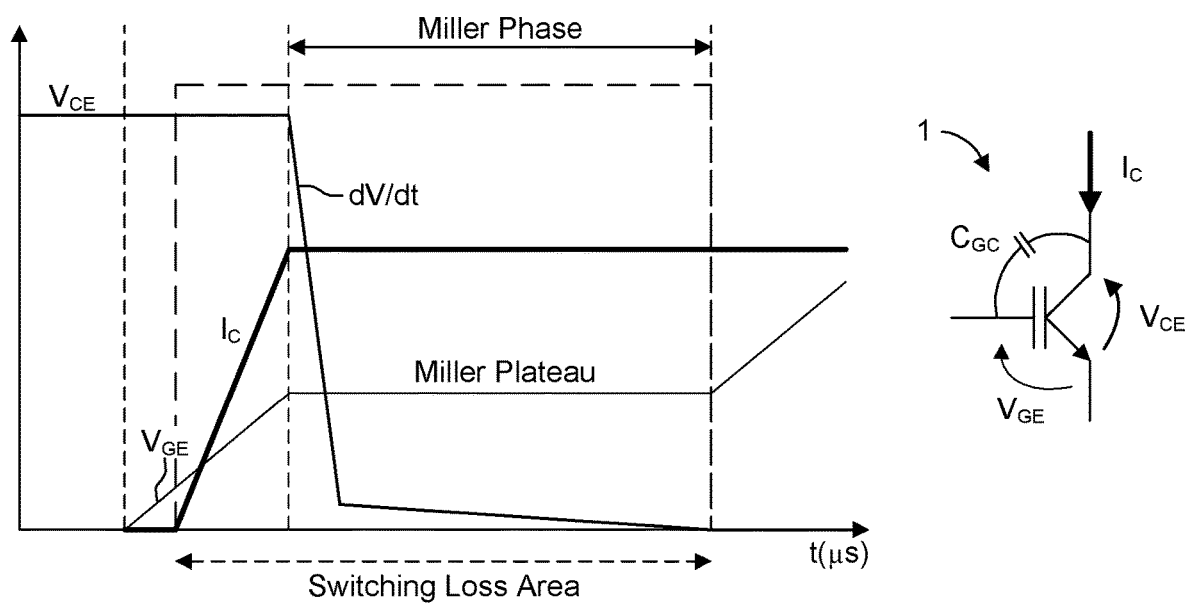
FIG. 1, on the left, illustrates a voltage-circuit diagram of a dV/dt behavior in power switches, and, on the right, a schematic representation of a power switch according to one or more embodiments.

In the following, details are set forth to provide a more thorough explanation of the exemplary embodiments. However, it will be apparent to those skilled in the art that embodiments may be practiced without these specific details. In other instances, well-known structures and devices are shown in block diagram form or in a schematic view rather than in detail in order to avoid obscuring the embodiments. In addition, features of the different embodiments described hereinafter may be combined with each other, unless specifically noted otherwise.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

In this regard, directional terminology, such as "top", "bottom", "below", "above", "front", "behind", "back", "leading", "trailing", etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope defined by the claims. The following detailed description, therefore, is not to be taken in a limiting sense.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In embodiments described herein or shown in the drawings, any direct electrical connection or coupling, i.e., any connection or coupling without additional intervening elements, may also be implemented by an indirect connection or coupling, i.e., a connection or coupling with one or more additional intervening elements, or vice versa, as long as the general purpose of the connection or coupling, for example, to transmit a certain kind of signal or to transmit a certain kind of information, is essentially maintained. Features from different embodiments may be combined to form further embodiments. For example, variations or modifications described with respect to one of the embodiments may also be applicable to other embodiments unless noted to the contrary.

The term "substantially" may be used herein to account for small manufacturing tolerances (e.g., within 5%) that are deemed acceptable in the industry without departing from the aspects of the embodiments described herein.

A signal processing circuit and/or a signal conditioning circuit may receive one or more signals (i.e., measurement signals) from one or more components in the form of raw measurement data and may derive, from the measurement signal further information. Signal conditioning, as used herein, refers to manipulating an analog signal in such a way that the signal meets the requirements of a next stage for further processing. Signal conditioning may include converting from analog to digital (e.g., via an analog-to-digital converter), amplification, filtering, converting, biasing, range matching, isolation and any other processes required to make a signal suitable for processing after conditioning.

Thus, a signal processing circuit may include an analog-to-digital converter (ADC) that converts the analog signal from the one or more components to a digital signal. The signal processing circuit may also include a digital signal processor (DSP) that performs some processing on the digital signal.

A power transistor, also referred to as a power switch or a transistor switch, is a power semiconductor device that may be used to drive a load current. For example, an IGBT is turned "ON" or "OFF" by activating and deactivating its gate terminal. Applying a positive input voltage signal across the gate and the emitter will keep the device in its "ON" state, while making the input gate signal zero or slightly negative will cause it to turn "OFF". There is a turn-on process and a turn-off process for switching the power transistor on and off.

During the turn-on process, a gate driver integrated circuit (IC) may be used to provide (source) a gate current (i.e., an ON current) to the gate of the power transistor in order to charge the gate to a sufficient voltage to turn-on the device. In particular, current Io+ is a gate driver output current Ig that flows from the gate driver IC to the gate used to rise (i.e., charge) the gate of the power transistor during a turn-on transient. Thus, it is used to turn-on the power transistor.

In contrast, during the turn-off process, the gate driver IC is used to draw (sink) a gate current (i.e., an off current) from the gate of the power transistor in order to discharge the gate sufficiently to turn-off the device. Current Io− is a gate driver output current Ig that flows from the gate to the gate driver IC used to discharge the gate of the power transistor during a turn-off transient. Thus, it is used to turn-off the power transistor.

A voltage pulse may be output from the gate driver IC as the control signal according to a pulse width modulation (PWM) scheme. Thus, the control signal may be switched between an ON voltage level and an OFF voltage level during a PWM cycle for controlling a power transistor. This in turn charges and discharges the gate voltage to turn-on and off the power transistor, respectively.

In particular, the gate of a power transistor is a capacitive load, and the turn-on current (i.e., gate source current) and the turn-off current (i.e., gate sink current) are specified as the initial current when a switching event is initiated. During a turn-off event, after some small amount of time (small compared to the PWM period), the gate current decreases and reaches a zero value when the gate reaches 0V. During a turn-on event, after some small amount of time (small compared to the PWM period), the gate current decreases and reaches a zero value when the gate reaches 15V.

Transistors may include Insulated Gate Bipolar Transistors (IGBTs) and Metal Oxide Semiconductor Field Effect Transistors (MOSFETs) (e.g., Si MOSFETs or SiC MOSFETs). While IGBTs may be used as an example in the embodiments below, it will be appreciated that MOSFETs may be substituted for the IGBTs and vice versa. In this context, when substituting a MOSFET for an IGBT, a MOSFET's drain may be substituted for an IGBT's collector, the MOSFET's source may be substituted for the IGBT's emitter, and the MOSFETs drain-source voltage $V_{DS}$ may be substituted for the IGBT's collector-emitter voltage $V_{CE}$ in any one of the examples described herein. Thus, any IGBT module may be substituted by a MOSFET module and vice versa.

Specific embodiments described in this specification pertain to, without being limited thereto, a power semiconductor device that may be used within a power converter or a power supply. Thus, in an embodiment, the power semiconductor device may be configured to carry a load current that is to be supplied to a load and/or, respectively, that is provided by a power source. For example, the semiconductor device may comprise one or more power semiconductor cells, such as a monolithically integrated diode cell, and/or a monolithically integrated transistor cell. Such diode cell and/or such transistor cells may be integrated in a power semiconductor module.

Power semiconductor devices that include transistors which are suitably connected to form half-bridges are commonly used in the field of power electronics. For example, half-bridges may be used for driving electric motors or switched mode power supplies.

For example, a three-phase inverter includes three inverter legs, one for each of the three phases, and each inverter leg is connected to a direct current (DC) voltage source in parallel to each other. Each inverter leg includes a pair of power transistors, for example, arranged in a half-bridge configuration for converting DC to AC. In other words, each inverter leg includes two complementary transistors (i.e., a high-side transistor and a low-side transistor) connected in series and which switch on and off complementary to the each other for driving a phase load. However, multi-phase inverters are not limited to three phases, and may include two phases or more than three phases, with an inverter leg for each phase.

Figure 2:
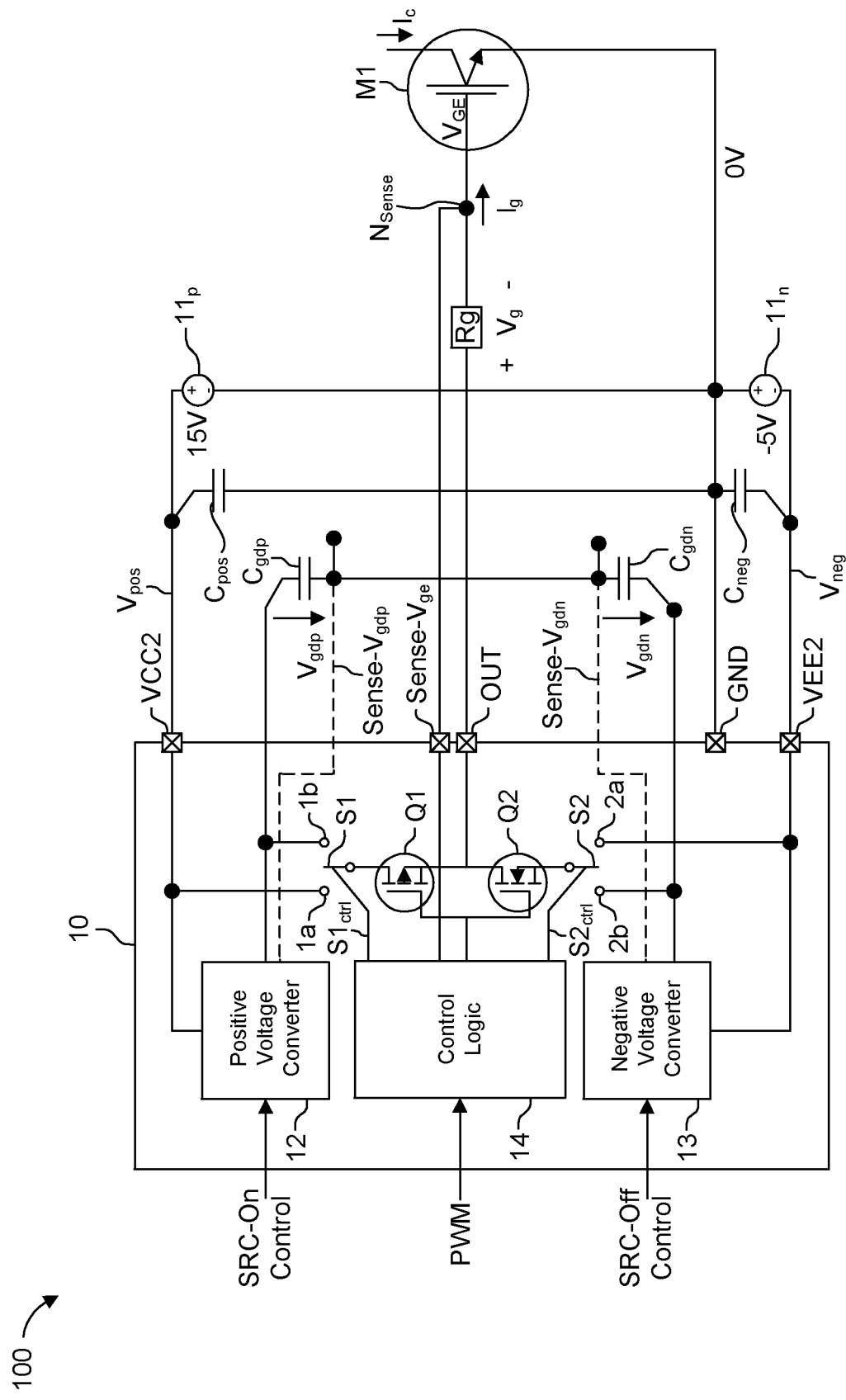
FIG. 2 shows a schematic block diagram illustrating a gate voltage control circuit configured to control a power transistor according to one or more embodiments.

FIG. 2 shows a schematic block diagram illustrating a gate voltage control circuit 100 configured to control a power transistor M1 according to one or more embodiments. The gate voltage control circuit 100 is a device in which the supply voltage coupled to current sources Q1 and Q2 (i.e., source FET Q1 and sink FET Q2) is no longer fixed, but adjustable, in order to increase or decrease the gate current Ig during the Miller phase of operation. As a result, the switching behavior of the power transistor M1 may be changed over the operating conditions of the power transistor M1 and to compensate for the Miller effect.

For example, the switching energy at high collector/drain current currents could be reduced, if more gate current Ig is applied during the Miller phase. Vice versa, a more suitable electromagnetic interference (EMI) spectrum could be achieved, if less gate current Ig is applied at low collector/drain current conditions. The gate voltage control circuit 100 introduces an additional independent and adjustable supply voltage, which is used only during the gate voltage transient (e.g., during the Miller phase). The gate voltage control circuit 100 provides active adaptation of the effective gate drive voltage Vg across the gate resistor Rg in order to achieve different gate current levels for gate current Ig during operation. As a result, the gate current Ig itself is adapted and may be regulated to be constant during the switching event (i.e., for gate current Ig to be constant throughout the transient) by regulating the voltage at the output terminal OUT of the gate driver IC 10. Additionally or alternatively, the gate current Ig is adapted and may be regulated to be constant during each and every Miller phase independent of the Miller Voltage. Thus, the gate current Ig may be regulated in order to maintain a constant effective gate drive voltage Vg during the Miller phase.

As noted above, current Io+ is an alternative notation for the gate current Ig that flows from the gate driver IC output terminal OUT to the gate and used to raise (i.e., charge) the gate of the power transistor M1 during a turn-on transient. In addition, current Io− is an alternative notation for the gate current Ig that flows from the gate to the gate driver IC output terminal OUT and used to discharge the gate of the power transistor M1 during a turn-off transient. Thus, the current Io+ may be set and/or adjusted during a turn-on switching event of the power transistor M1 by adjusting the power supply voltage provided to source FET Q1. Similarly, the current Io− may be set and/or adjusted during a turn-off switching event of the power transistor M1 by adjusting the power supply voltage provided to sink FET Q2. It is noted that source FET Q1 and sink FET Q2 are operated complementarily to each other.

The gate voltage control circuit 100 includes a gate driver IC 10 configured to drive the power transistor M1. The gate driver IC 10 provides a gate drive voltage at its output terminal OUT, which is coupled to the gate terminal of the power transistor M1 via a gate resistor Rg. The voltage across the gate resistor is referred to as the effective gate drive voltage because it is the voltage that directly influences the gate current Ig responsible for charging or discharging the gate-collector capacitance $C_{GC}$ of the power transistor. As noted above, the gate voltage $V_{GE}$ may change as the power transistor is turned fully on (i.e., during the turn-on transient) or turned fully off (i.e., during the turn-off transient), and the gate current Ig may decrease during one of the transients, resulting in longer switching times and higher power losses. The gate driver IC 10 is configured to prevent or mitigate this phenomenon.

The gate voltage control circuit 100 is a bipolar gate drive circuit coupled to a bipolar power supply 11p and 11n having a positive gate voltage bias of 15V provided by a positive voltage supply rail Vpos and a negative gate voltage bias of −5V provided by a negative voltage supply rail Vneg. However, these voltages are configurable. Capacitors Cpos and Cneg are used to stabilize the rail voltages provided to terminals VCC2 and VEE2 of the gate driver IC 10. The gate driver IC 10 also includes a ground terminal GND coupled to ground.

Alternatively, the gate voltage control circuit 100 may be a unipolar gate drive circuit coupled to a unipolar power supply (e.g., the negative voltage supply rail is coupled to ground). Even with a unipolar power supply, the gate voltage control circuit 100 may be configured to drive in a bipolar manner.

The source FET Q1 is configured to be turned on in order to supply the positive gate voltage bias from the supply rail Vpos or an adjusted positive gate voltage bias from a positive voltage converter 12 via switch S1 to the gate of the power transistor M1. Similarly, the sink FET Q2 is configured to be turned on in order to supply the negative gate voltage bias from the supply rail Vneg or an adjusted negative gate voltage bias from a negative voltage converter 13 via switch S2 to the gate of the power transistor M1.

The gate driver IC 10 is supplied with a fixed positive voltage and a fixed negative voltage from supply rails Vpos and Vneg, respectively. The gate resistor Rg connects the output terminal OUT of the gate driver IC 10 with the gate terminal of the transistor M1. As such, the gate current Ig is generated based on the gate resistor Rg, the on/off state of the source and sink FETs Q1 and Q2, and the gate drive voltage coupled to a load path terminal of the respective FET Q1 or Q2. More particularly, the gate current Ig is defined by the difference between the voltage at the output terminal OUT and the instantaneous voltage $V_{GE}$ of the power transistor M1.

The gate current Ig can be adjusted by varying the positive gate voltage bias (i.e., the positive gate drive voltage) coupled to and then provided by the output terminal OUT of the gate driver IC 10, for example, during a turn-on switching event defined by the gate voltage transient from Vneg to Vpos. More particularly, the gate current Ig may be adjusted during the Miller phase of the turn-on switching event. Adjusting the positive gate drive voltage effectively regulates the effective gate drive voltage Vg across the gate resistor Rg, thereby regulating the gate current Ig.

Similarly, the gate current Ig can be adjusted by varying the negative gate voltage bias (i.e., the negative gate drive voltage) coupled to and then provided by the output terminal OUT of the gate driver IC 10, for example, during a turn-off switching event defined by the gate voltage transient from Vpos to Vneg. More particularly, the gate current Ig may be for the Miller phase of the turn-off switching event. Adjusting the negative gate drive voltage effectively regulates the effective gate drive voltage Vg across the gate resistor Rg, thereby regulating the gate current Ig.

The gate driver IC 10 includes a positive voltage converter 12 configured to modulate positive rail voltage supplied to the output terminal OUT in order to provide a constant gate current Ig through gate resistor Rg during at least the Miller phase of the turn-on switching event. The gate driver IC 10 includes a sense terminal Sense_vge electrically coupled to the output of the gate resistor Rg to measure the gate-emitter voltage $V_{GE}$ at sense node $N_{sense}$. As noted above, the Miller voltage (gate-emitter voltage $V_{GE}$) increases as the collector current Ic increases. Thus, the voltage at the output of the gate resistor Rg may be measured for a few reasons.

First, the gate-emitter voltage $V_{GE}$ at sense node $N_{sense}$ may be measured (i.e., monitored) by the control logic 14 in order to detect the Miller phase, and, more particularly, to detect when the Miller phase has ended. This event may be detected when gate-emitter voltage $V_{GE}$ starts to increase after being constant (e.g., to detect an increase after the Miller plateau). Once the Miller phase has ended, clamping to Vpos or Vneg, as described below, may be enabled. Until then, clamping may be disabled. Additionally, the Miller voltage may be recorded and used as feedback information to adapt Vgdp and/or Vgdn for the next pulse (i.e., for the next switching event).

Second, the gate-emitter voltage $V_{GE}$ at sense node $N_{sense}$ may be measured (i.e., monitored) by the control logic 14 in order to determine exactly when clamping to Vpos or to Vneg should be activated (i.e., implemented) via switches S1 and S2.

The gate driver IC 10 also includes a negative voltage converter 13 configured to modulate negative rail voltage supplied to the output terminal OUT in order to provide a constant gate current during at least the Miller phase of the turn-off switching event. The gate driver IC 10 includes the sense terminal Sense_vge electrically coupled to the output of the gate resistor Rg to measure the gate-emitter voltage $V_{GE}$ at sense node $N_{sense}$. As noted above, the Miller voltage (gate-emitter voltage $V_{GE}$) decreases as the collector current Ic decreases. Thus, the voltage at the output of the gate resistor Rg may be measured for similar reasons set for above (e.g., to detect when the Miller phase has ended, to record the Miller voltage as feedback information for adjusting Vgdp and/or Vgdn, and to determine when to activate clamping).

Either converter 12 or 13 may be an up-down converter, an up converter, or a down converter depending on the configuration. It will be further appreciated that only one of the converters 12 or 13 may be implemented in the gate voltage control circuit 100 depending on the application.

The gate voltage control circuit 100 includes blocking capacitors Cgdp and Cgdn coupled to the output of a corresponding converter 12 or 13. The blocking capacitors Cgdp and Cgdn are configured to stabilize the output of its corresponding converter 12 or 13 and to provide enough reservoir for the converter voltage to be supplied to the gate of the transistor M1.

The dotted lines Sense_vgdp and Sense_vgdn represent optional electrical connections. In particular, they are possible sense lines for each converter 12 and 13 to measure the voltage across each blocking capacitor Cgdp and Cgdn (i.e., to measure voltage Vgdp and voltage Vgdn, respectively). Converter 12 may then include a feedback control loop based on the measured voltage Vgdp from sense line Sense_vgdp in order to ensure that voltage Vgdp is at the desired level instructed by the SRC-on control signal, and adjust its output voltage accordingly if there is a deviation therefrom. Similarly, converter 13 may include a feedback control loop based on the measured voltage Vgdn from sense line Sense_vgdn in order to ensure that voltage Vgdn is at the desired level instructed by the SRC-off control signal, and adjust its output voltage accordingly if there is a deviation therefrom. Without the sense lines Sense_vgdp and Sense_vgdn, the converters 12 and 13 may perform open loop control of their output voltages.

The gate driver IC 10 includes a switch S1 coupled to a load path terminal of the source FET Q1 and is configured to switchably couple the source FET Q1 to one of two positive rail voltage sources based on switch position 1a or switch position 1b. The positive rail voltage sources include the positive supply rail Vpos that supplies the fixed positive rail voltage and the positive voltage converter 12 that provides a modulated positive rail voltage Vgdp generated from the fixed positive rail voltage.

The positive voltage converter 12 is configured to receive the fixed positive rail voltage from the positive supply rail Vpos and convert the fixed positive rail voltage into a higher or lower voltage based on a slew rate control (SRC)-on control signal. The SRC-on control signal may be provided by an external controller (not illustrated) and may include information, such as a voltage amplitude level, that sets a voltage output value Vgdp of the positive voltage converter 12. If faster switching of transistor M1 is desired, the positive voltage converter 12 may be configured to convert the fixed positive rail voltage to a higher (more positive) voltage. On the other hand, if slower switching of transistor M1 is desired, the positive voltage converter 12 may be configured to convert the fixed positive rail voltage to a lower (less positive) voltage.

The gate driver IC 10 also includes a switch S2 coupled to a load path terminal of the sink FET Q2 and is configured to switchably couple the sink FET Q2 to one of two negative rail voltage sources based on switch position 2a or switch position 2b. The negative rail voltage sources include the negative supply rail Vneg that supplies the fixed negative rail voltage and the positive voltage converter 13 that provides a modulated negative rail voltage Vgdn generated from the fixed negative rail voltage.

The negative voltage converter 13 is configured to receive the fixed negative rail voltage from the negative supply rail Vneg and convert the fixed negative rail voltage into a higher or lower voltage based on an SRC-off control signal. The SRC-off control signal may be provided by an external controller (not illustrated) and may include information, such as a voltage amplitude level, that sets a voltage output value Vgdn of the negative voltage converter 13. If faster switching of transistor M1 is desired, the negative voltage converter 13 may be configured to convert the fixed negative rail voltage to a lower (more negative) voltage. On the other hand, if slower switching of transistor M1 is desired, the negative voltage converter 13 may be configured to convert the fixed negative rail voltage to a higher (less negative) voltage.

The external controller is also configured to provide one or more PWM control signals to the gate driver IC's control logic 14 that includes control circuitry. The control logic 14 includes circuitry that receives the PWM control signals and, based on the PWM control signals, controls the on/off state of the source FET Q1 and sink FET Q2 to generate the gate current Ig (i.e., gate current Io+ or gate current Io−). The control logic 14 also provides control signals to switches S1 and S2 via control lines S1ctrl and S2ctrl, respectively, to control their respective switching states/ positions based on the sensed voltage received at the sense terminal Sense_vge and based on a clamping control circuit.

Voltage converters 12 and 13 may be configured to make a pre-adjustment of Vgdp and Vgdn respectively, prior to the Miller phase (e.g., at a time an on or off switching event is triggered), and maintain the modulated voltages Vgdp and Vgdn constant throughout the Miller event and even throughout most of the switching event. In addition, voltage converters 12 and 13 can vary Vgdp and Vgdn pulse-by-pulse (i.e., for each PWM pulse) and thus for each discrete switching event.

Even though the gate drive voltage may be higher or lower than the supply voltage of the gate driver IC during a transient interval of the gate voltage during the switching event (i.e., a turn-on transient or a turn-off transient), the voltage level during static on-state or static off-state (i.e., during a clamping interval) can nevertheless be the supply voltage levels which are Vpos and Vneg. The static on-state is defined by the interval when the transistor is fully turned on following the turn-on transient of the gate voltage. In the static on-state, the gate voltage is clamped to Vpos by switch S1 being coupled to position 1a. Similarly, the static off-state is defined by the interval when the transistor is fully turned off following the turn-off transient of the gate voltage. In the static off-state, the gate voltage is clamped to Vneg by switch S2 being coupled to position 2a.

Figure 3A:
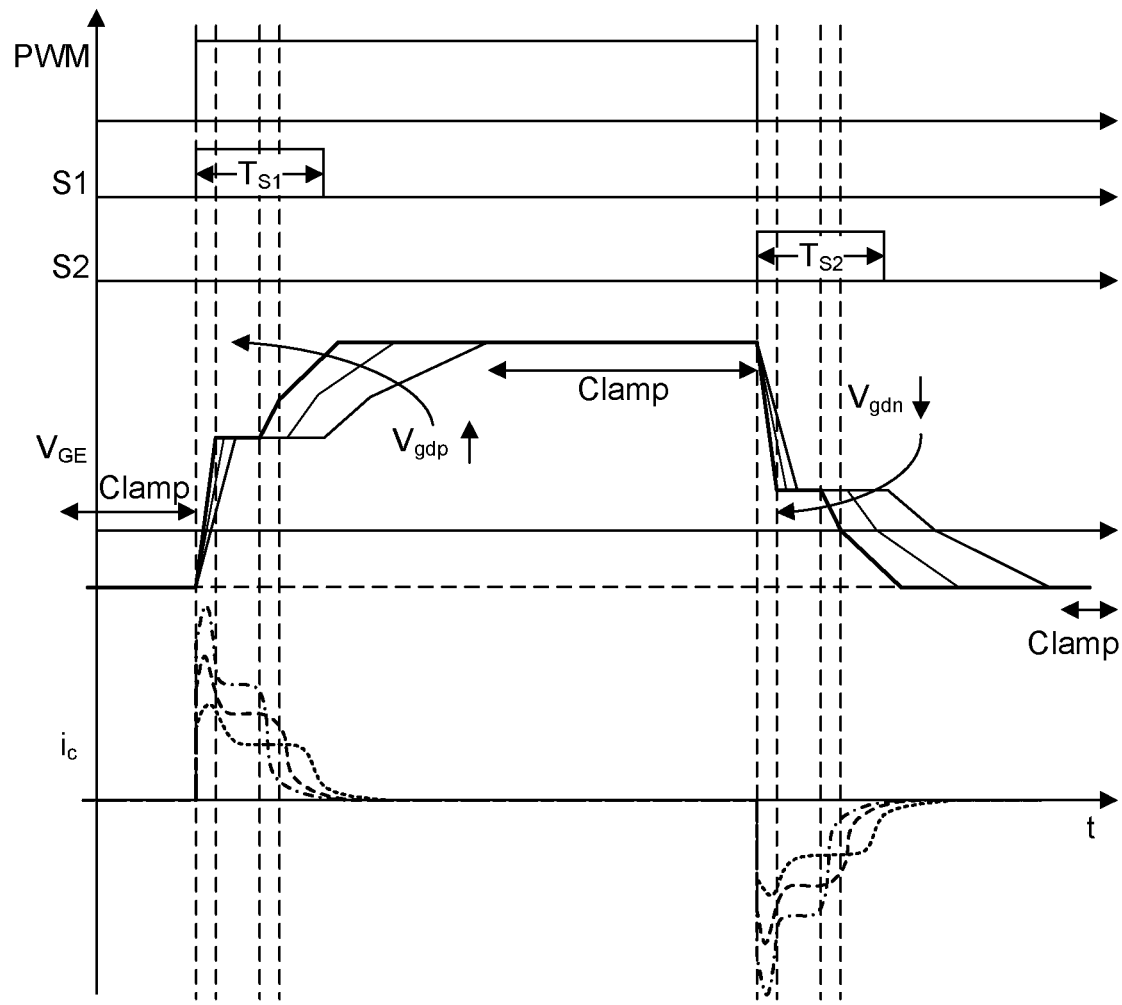
FIG. 3A is a timing diagram for switches S1 and S2 based on a PWM control signal according to one or more embodiments.

FIG. 3A is a timing diagram for switches S1 and S2 based on a PWM control signal according to one or more embodiments. The control pulse for switch S1 is high when the switch is in position 1b. The length of this control pulse is adjustable based on the desired rise time of $V_{GE}$. Similarly, the control pulse for switch S2 is high when the switch is in position 2b. The length of this control pulse is adjustable based on the fall time of $V_{GE}$. The length $T_{S1}$ and $T_{S2}$ of the switch control pulses may be adjusted based on the gate voltage $V_{GE}$ measured at the sense terminal Sense_vge using comparators or based on a preconfigured time period using timers.

Figure 3B:
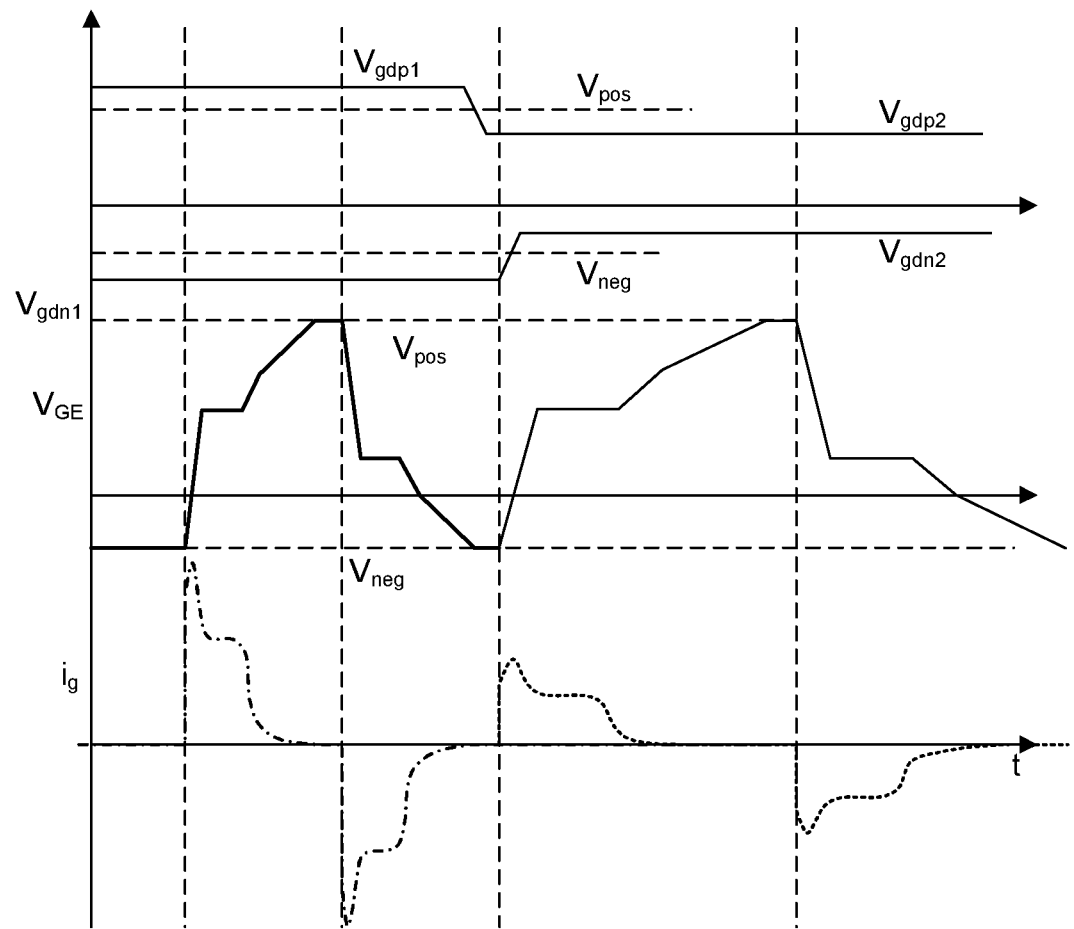
FIG. 3B is a signal diagram for gate drive voltages for an up-down converter according to one or more embodiments.

FIG. 3B is a signal diagram for gate drive voltages for an up-down converter according to one or more embodiments, where Vgdp1 and Vgdp2 are different positive gate drive voltages and Vgdn1 and Vgdn2 are different negative gate drive voltages.

Figure 4:
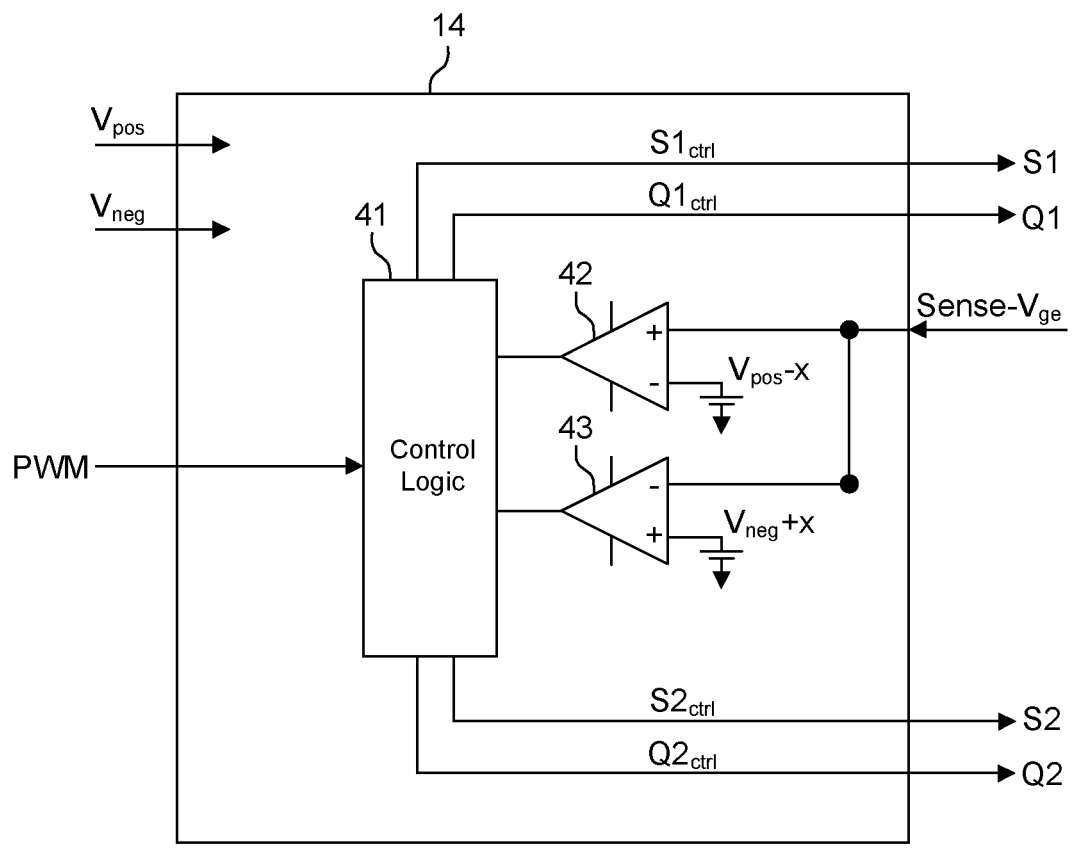
FIG. 4 illustrates a schematic block diagram of the control logic of a gate driver IC according to one or more embodiments.

FIG. 4 illustrates a schematic block diagram of the control logic 14 of the gate driver IC 10 according to one or more embodiments. The control logic 14 includes a logic circuit 41 that receives a PWM control signal and controls the source and sink FETs Q1 and Q2 based thereon using control signals Q1ctrl and Q2ctrl, respectively.

The control logic 14 also includes a clamping control circuit that includes the logic circuit 41 and two comparators 42 and 43. The clamping control circuit is configured to receive the gate-emitter voltage $V_{GE}$ from the sense node Nsense to determine a control decision for the switches S1 and S2.

For example, the clamping control circuit may include a first comparator 42 that receives the sensed voltage $V_{GE}$ at its non-inverting terminal and a positive reference voltage Vpos−X at its inverting terminal, where X is a predetermined voltage amount. Thus, the positive reference voltage is set to be less than the fixed voltage of the positive supply rail Vpos by amount X. When the sensed voltage $V_{GE}$ is greater than the positive reference voltage, the logic is configured to switch S1 from switch position 1b to switch position 1a so that the gate of the transistor M1 is not overcharged (i.e., to prevent the gate from being charged more than the positive supply rail Vpos). Here, it is said that the gate drive voltage is clamped to the supply voltage Vpos once the sensed voltage $V_{GE}$ is greater than the positive reference voltage. Otherwise, the switch S1 is set to switch position 1b. Thus, the switch S1 is set to switch position 1b during the transient interval of the gate voltage $V_{GE}$ for the on-switching event, including before and after the Miller phase, up to the point where $V_{GE}$ is equal to or substantially equal to the positive reference voltage, where substantially equal is defended by the positive reference voltage. That is, the gate may still charge slightly from the positive reference voltage Vpos–X to the fixed supply voltage Vpos after the switch S1 changes position from 1b to 1a until it reaches the fixed supply voltage Vpos. If X=0, then the switch S1 is set to position 1b during the entire transient interval of the gate voltage $V_{GE}$ for the on-switching event. On the other hand, if X is greater than zero, switch S1 changes position from 1b to 1a during the transient interval (i.e., prior to the static state), although after the Miller phase. Thus, switch S1 can already be coupled to the fixed supply voltage Vpos toward the end of the transient interval of $V_{GE}$, i.e., at some voltage between Vpos and the Miller plateau.

The positive reference voltage may be set to a level that represents that the gate transient is complete and the transistor is fully turned on. Furthermore, overcharging the gate may increase the risk of a short circuit. Thus, clamping the gate of the transistor M1 to the positive supply rail Vpos once the transistor is fully turned on mitigates the risk of a short circuit.

The clamping control circuit may further include a second comparator 43 that receives the sensed voltage $V_{GE}$ at its inverting terminal and a negative reference voltage Vneg+X at its inverting terminal, where X is a predetermined voltage amount. Thus, the negative reference voltage is set to be greater (less negative) than the fixed voltage of the negative supply rail Vneg by amount X. When the sensed voltage $V_{GE}$ is less (more negative) than the negative reference voltage, the logic is configured to switch S2 from switch position 2b to switch position 2a so that the gate of the transistor M1 is not overcharged (i.e., to prevent the gate from being charged to be less (more negative) than the negative supply rail Vneg). Here, it is said that the gate drive voltage is clamped to the supply voltage Vneg once the sensed voltage $V_{GE}$ is less (more negative) than the negative reference voltage. Otherwise, the switch S2 is set to switch position 2b. Thus, the switch S2 is set to switch position 2b during the transient interval of the gate voltage $V_{GE}$ for the off-switching event, including before and after the Miller phase, up to the point where $V_{GE}$ is equal to or substantially equal to the negative reference voltage, where substantially equal is defended by the negative reference voltage. That is, the gate may still discharge slightly from the negative reference voltage Vneg+X to the fixed supply voltage Vneg after the switch S2 changes position from 2b to 2a until it reaches the fixed supply voltage Vneg. If X=0, then the switch S2 is set to position 2b during the entire transient interval of the gate voltage $V_{GE}$ for the off-switching event. On the other hand, if X is greater than zero, switch S2 changes position from 2b to 2a during the transient interval (i.e., prior to the static state), although after the Miller phase. Thus, switch S2 can already be coupled to the fixed supply voltage Vneg toward the end of the transient interval of $V_{GE}$, i.e., at some voltage between Vneg and the Miller plateau.

The negative reference voltage may be set to a level that represents that the gate transient is complete and the transistor is fully turned off. Thus, clamping the gate of the transistor M1 to the negative supply rail Vneg once the transistor is fully turned off mitigates the risk of overcharging the transistor M1.

Figure 5:
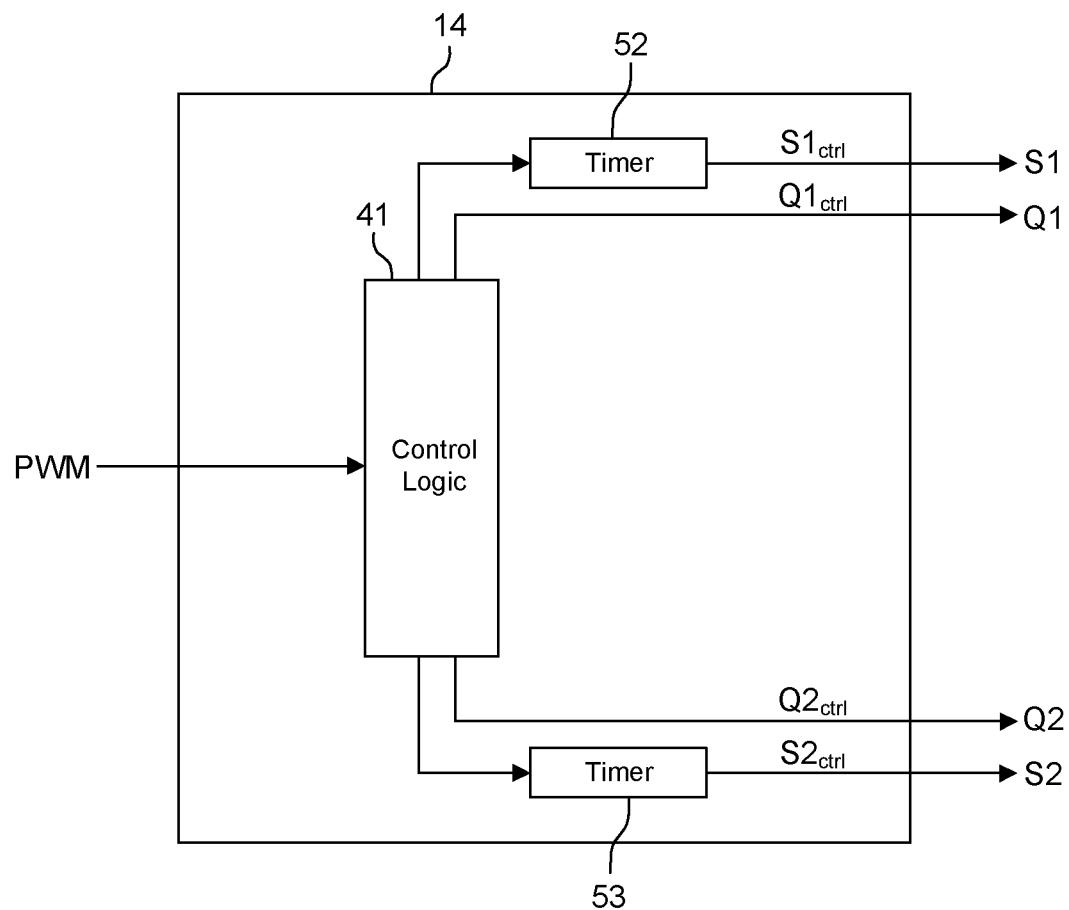
FIG. 5 illustrates a schematic block diagram of the control logic of a gate driver IC according to one or more embodiments.

FIG. 5 illustrates a schematic block diagram of the control logic 14 of the gate driver IC 10 according to one or more embodiments. The control logic 14 includes a logic circuit 41 that receives a PWM control signal and controls the source and sink FETs Q1 and Q2 based thereon using control signals Q1ctrl and Q2ctrl, respectively.

The control logic 14 also includes a clamping control circuit that includes the logic circuit 41 and two timers 52 and 53. Accordingly, the gate driver IC 10 may use timers 52 and 53 to control the switches S1 and S2. As a result, the timers 52 and 53 are used to switchably couple the source and sink FETs Q1 and Q2 to either a corresponding modulated rail voltage or a corresponding fixed rail voltage, as described above.

In particular, the timers 52 and 53 in combination with edge triggering (rising edge and/or falling edge) based on the pulses of the PWM control signal may be used by the control logic 14 to control the switch position of switches S1 and S2. The control circuit 41 is configured to trigger a start of the timers 52 and 53 based on edge triggering of the PWM control signal, and the timers 52 and 53 are configured to generate a switch control signal S1ctrl or S2ctrl based on passing of a predetermined time interval.

For example, the control logic 14 couples switch S1 to position 1b (i.e., to the modulated positive rail voltage Vgdp) upon detecting a rising edge of the PWM control signal and switches switch S1 from position 1b to position 1a upon passing of a first predetermined time period tracked via the timer 52. The logic circuit 41 may trigger a start of the timer 52 upon detecting the rising edge of the PWM signal. In response to the trigger signal, the timer 52 starts counting and also ensures that switch S1 is in position 1b using switch control signal S1ctrl until the first predetermined time period lapses. Then, after the first predetermined time period lapses, the timer 52 changes the switch control signal S1ctrl such that switch S1 changes from position 1b to position 1a.

Similarly, the control logic 14 couples switch S2 to position 2b (i.e., to the modulated negative rail voltage Vgdn) upon detecting a falling edge of the PWM control signal and switches switch S2 from position 2b to position 2a upon passing of a second predetermined time period tracked via the timer 53. The logic circuit 41 may trigger a start of the timer 53 upon detecting the falling edge of the PWM signal. In response to the trigger signal, the timer 53 starts counting and also ensures that switch S2 is in position 2b using switch control signal S2ctrl until the second predetermined time period lapses. Then, after the second predetermined time period lapses, the timer 53 changes the switch control signal S2ctrl such that switch S2 changes from position 2b to position 2a.

The first and second predetermined time periods may be independently configurable for each switch S1 and S2, and thus the respective switching periods may be different from each other.

Instead of a single PWM control signal, there may be a first dedicated control signal for the turning on of the power transistor M1 (i.e., turning on the source FET Q1) and a second dedicated control signal for the turning off of the power transistor M1 (i.e., turning on the sink FET Q2). In this case, the control logic 14 couples switch S1 to position 1b (i.e., to the modulated positive rail voltage Vgdp) upon detecting a rising edge of the first dedicated control signal and switches switch S1 from position 1b to position 1a upon a lapse of a first predetermined time period tracked via the timer 52. The timer 52 is started upon detecting the rising edge of the first dedicated control signal.

In addition, the control logic 14 couples switch S2 to position 12 (i.e., to the modulated negative rail voltage Vgdn) upon detecting a rising edge of the second dedicated control signal and switches switch S2 from position 2*b* to position 2*a* upon a lapse of a second predetermined time period, which may be the same or different from the first predetermined time period tracked via the timer 53. The timer 53 is started upon detecting the rising edge of the second dedicated control signal.

Figure 6:
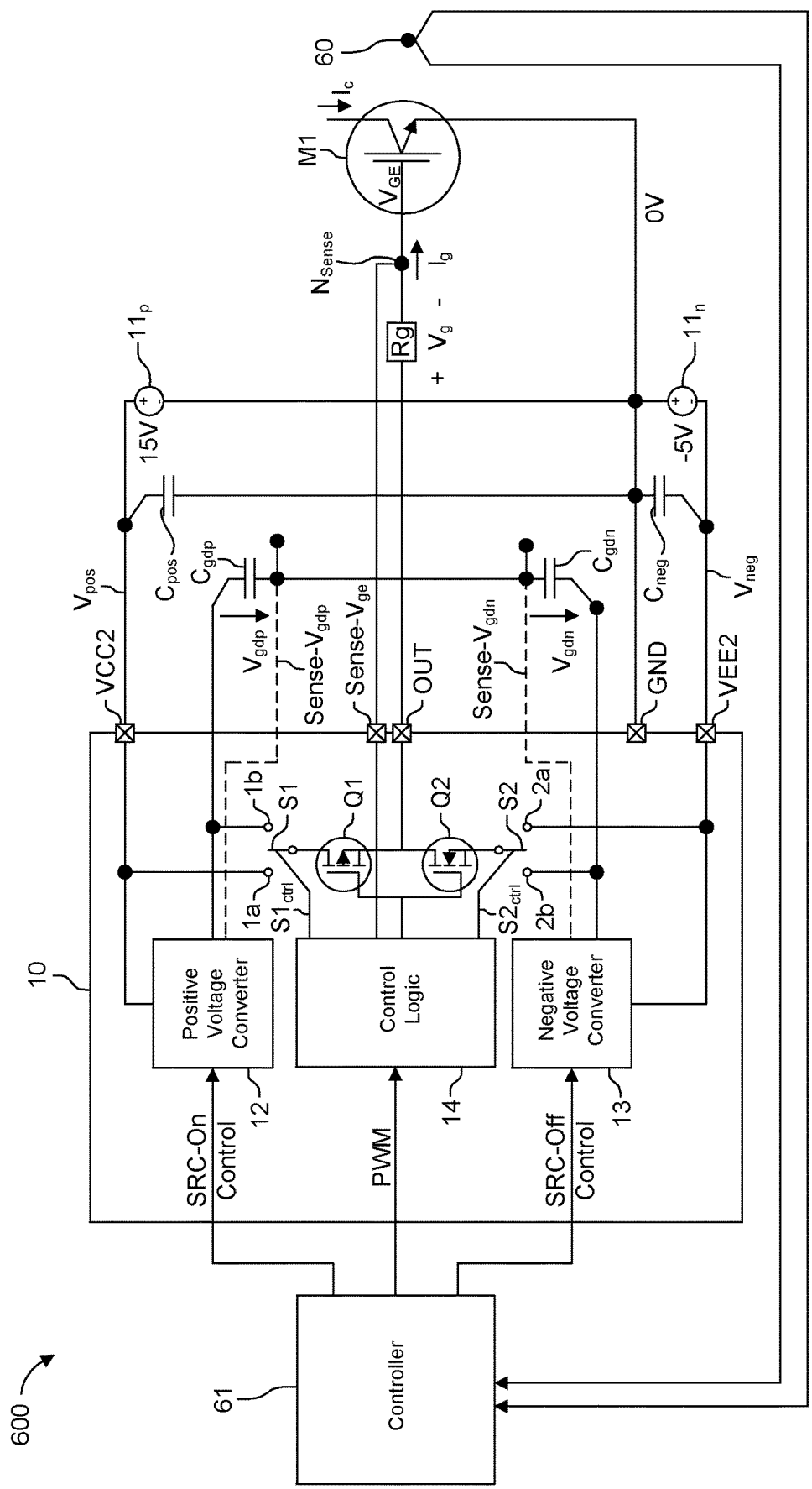
FIGS. 6 and 7 show schematic block diagrams of gate voltage control circuits with self-adjusting feedback correction according to one or more embodiments.
Figure 7:
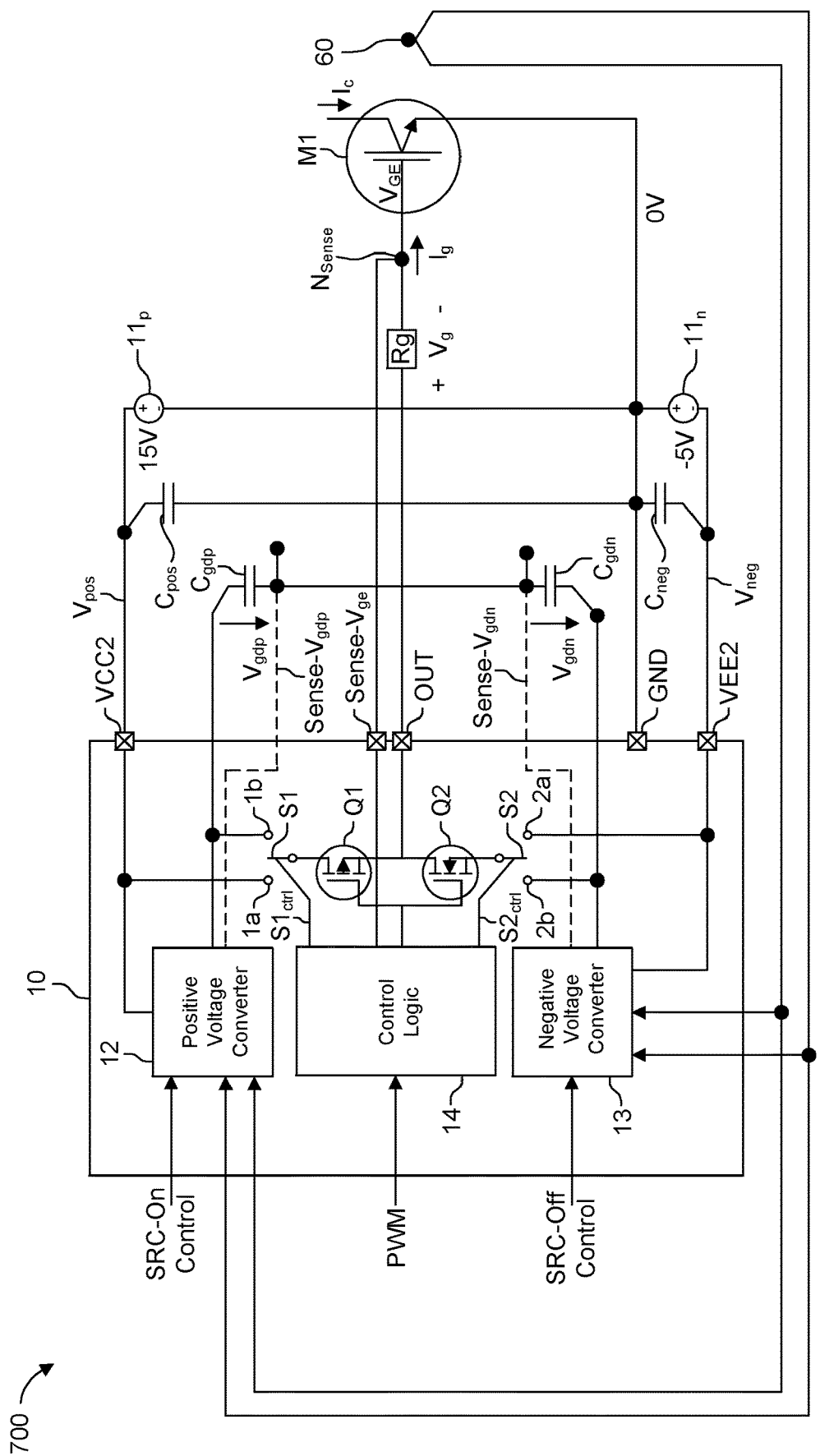

FIGS. 6 and 7 show schematic block diagrams of a gate voltage control circuit with self-adjusting feedback correction according to one or more embodiments. The gate voltage control circuit 600 shown in FIG. 6 and gate voltage control circuit 700 shown in FIG. 7 are similar to the gate voltage control circuit 100 shown in FIG. 1, except they further include a self-adjusting feedback correction function using sensors 60.

The self-adjusting feedback correction function is a control function for the automatic update of the two input control signals SRC-On and SRC-Off and can be implemented as shown in FIGS. 6 and 7. The inputs signals for the control function can be temperatures, such as heatsink temperatures, power transistor temperature, or load information, such as shunt voltage levels or other load current sensors. Thus, sensors 60 may include one or more of a temperature sensor, a current sensor, or a voltage sensor configured to measure a corresponding physical quality and provide sensor information to converter control circuitry. The converter control circuitry may be an external controller 61, as shown in FIG. 6, or the converters 12 and 13, as shown in FIG. 7.

For example, the self-adjusting feedback correction may be based on operating temperature of the power transistor. Typically, hotter transistors switch slower and colder transistors switch faster. Thus, the temperature can be measured and an adjustment to the gate drive voltage via modulating the corresponding rail voltage can be made.

In FIG. 6, the external controller 61 may modulate the SRC-on control signal directly with the received sensor information. In this case, the external controller may receive temperature information or load information from the sensors 60 and directly adjust the voltage level (amplitude) information in the SRC-on control signal in order to set the output of the converter 12.

Similarly, the external controller 61 may modulate the SRC-off control signal directly with the received sensor information. In this case, the external controller may receive temperature information or load information from the sensors 60 and directly adjust the voltage level (amplitude) information in the SRC-off control signal in order to set the output of the converter 13.

Alternatively, as shown in FIG. 7, each converter 12 and 13 itself may make the adjustment to its output based on the temperature information or the load information received from the sensors 60 and based on the voltage level (amplitude) information received in the respective SRC control signal. In this way, each converter 12 and 13 calculates the correction to the voltage level (amplitude) for the converter output based on the sensor information and the voltage level (amplitude) information provided in the SRC control signal to achieve a desired switching speed for the power transistor M1. This can be done by the converters 12 and 13, for example, using a look-up table or implementing a control algorithm.

In view of the above, an incoming PWM pulse triggers the switch S1 to connect to the positive gate drive voltage Vgdp to Q1. Switch S1 remains in this position until the switching transient of power transistor M1 is finished. Then, switch S1 connects the gate of power transistor M1 to the supply voltage Vpos and clamps it. This ensures these two advantages: reducing the Qg-losses, and ensuring sufficient on-state gate voltage and short circuit capability of the power transistor.

The same applies for the turn-off sequence which uses switch S2. The incoming PWM turn-off signal triggers switch S2 to connect the source of the sink-FET Q2 with the negative gate drive voltage Vgdn. When reaching a gate voltage level lower than the gate-source threshold voltage, S2 connects to the negative supply voltage Vneg. This can also reduce the Qg-losses and provides sufficient off-state gate voltage.

The adjustment of the effective gate drive voltage by means of two active converters results in a variation of the gate current amplitude. This is indicated in the timing of the gate current signal Ig in FIG. 3B. A steeper rise/fall of the gate voltage indicates a faster switching of the power transistor. The decision for changing S1 or S2 can be derived from comparators or timers or both.

The following additional embodiments are provided:

1. A gate driver circuit, comprising: a first power supply rail configured to provide a first fixed supply voltage; a second power supply rail configured to provide a second fixed supply voltage; a transistor comprising a gate terminal having a gate voltage; a gate driver integrated circuit (IC) supplied with the first fixed supply voltage and the second fixed supply voltage, the gate driver IC comprising an output terminal coupled to the gate terminal of the transistor and configured to provide a gate drive voltage at the output terminal in order to drive the transistor between switching states; and a gate resistor coupled between the output terminal of the gate driver IC and the gate terminal of the transistor, wherein the gate resistor defines a gate current based on the gate drive voltage and the gate voltage, wherein the gate driver IC further comprises: a first voltage converter configured to receive the first fixed supply voltage and modulate an amplitude of the first fixed supply voltage to generate a first modulated supply voltage; and a first switch configured to selectively couple the first fixed supply voltage and the first modulated supply voltage to the output terminal of the gate driver IC in order to regulate the gate drive voltage.

2. The gate driver circuit of embodiment 1, wherein the first switch is configured to selectively couple the first fixed supply voltage and the first modulated supply voltage to the output terminal of the gate driver IC in order to regulate the gate current.

3. The gate driver circuit of embodiment 1, wherein the gate driver IC further comprises: a controller configured to control the first switch such that the first switch is coupled to the first modulated supply voltage during a transient interval of the gate voltage during a first switching event of the transistor, and control the first switch such that the first switch is coupled to the first fixed supply voltage during a first static state of the gate voltage, the first static state being contiguous to the transient interval.

4. The gate driver circuit of embodiment 3, wherein the controller is configured to control the first switch such that the first switch is coupled to the first modulated supply voltage during a Miller phase of the transient interval of the gate voltage during the first switching event.

5. The gate driver circuit of embodiment 3, wherein: the controller is configured to receive a PWM control signal and drive the transistor between the switching states based on the PWM control signal, and the controller is configured to detect a pulse edge of the PWM control signal and control the first switch such that the first switch is coupled to the first modulated supply voltage in response to detecting the pulse edge.

6. The gate driver circuit of embodiment 5, wherein: the controller comprises a timer, and the controller is configured to start the timer in response to detecting the pulse edge and control the first switch such that the first switch is coupled to the first fixed supply voltage in response to a predetermined time interval lapsing at the timer.

7. The gate driver circuit of embodiment 5, wherein: the controller is coupled to the gate terminal of the transistor and is configured to monitor the gate voltage and compare the monitored gate voltage to a threshold voltage value, and the controller is configured to control the first switch such that the first switch is coupled to the first fixed supply voltage in response to the monitored gate voltage exceeding the threshold voltage value.

8. The gate driver circuit of embodiment 7, wherein the threshold voltage value is the first fixed supply voltage.

9. The gate driver circuit of embodiment 7, wherein the threshold voltage value has a magnitude less than a magnitude of the first fixed supply voltage.

10. The gate driver circuit of embodiment 1, wherein: the first fixed supply voltage is a positive fixed supply voltage and the first modulated supply voltage is a modulated positive supply voltage, and the first switching event is a turn-on switching event of the transistor.

11. The gate driver circuit of embodiment 1, wherein: the first fixed supply voltage is a negative fixed supply voltage and the first modulated supply voltage is a modulated negative supply voltage, and the first switching event is a turn-off switching event of the transistor.

12. The gate driver circuit of embodiment 1, wherein the first voltage converter is configured to receive a slew rate control (SRC) control signal from an external controller, and generate the first modulated supply voltage based on voltage amplitude information provided by the SRC control signal.

13. The gate driver circuit of embodiment 12, further comprising: a sensor configured to measure physical quality of the gate driver circuit and generate a measurement signal, wherein the first voltage converter is configured to receive the measurement signal from the sensor and generate the first modulated supply voltage based on the voltage amplitude information provided by the SRC control signal and the measurement signal.

14. The gate driver circuit of embodiment 13, wherein the sensor is one of a temperature sensor configured to measure a temperature associated with the transistor, a voltage sensor configured to measure a load voltage corresponding to a load coupled to the transistor, or a current sensor configured to measure a load current corresponding to the load.

15. The gate driver circuit of embodiment 12, further comprising: a sensor configured to measure physical quality of the gate driver circuit and generate a measurement signal; and an external controller configured to receive the measurement signal from the sensor, generate the voltage amplitude information based on the measurement signal, and transmit the SRC control signal, including the voltage amplitude information, to the first voltage converter.

16. The gate driver circuit of embodiment 1, wherein the gate driver IC further comprises: a second voltage converter configured to receive the second fixed supply voltage and modulate an amplitude of the second fixed supply voltage to generate a second modulated supply voltage; and a second switch configured to selectively couple the second fixed supply voltage and the second modulated supply voltage to the output terminal of the gate driver IC in order to regulate the gate drive voltage.

17. The gate driver circuit of embodiment 16, wherein the gate driver IC further comprises: a controller configured to: control the first switch such that the first switch is coupled to the first modulated supply voltage during a first transient interval of the gate voltage during a first switching event of the transistor and coupled to the first fixed supply voltage during a first static state of the gate voltage, the first static state being contiguous to the first transient interval, and control the second switch such that the second switch is coupled to the second modulated supply voltage during a second transient interval of the gate voltage during a second switching event of the transistor and coupled to the second fixed supply voltage during a second static state of the gate voltage, the second static state being contiguous to the second transient interval.

18. The gate driver circuit of embodiment 17, wherein the controller is configured to: control the first switch such that the first switch is coupled to the first modulated supply voltage during a first Miller phase of the first transient interval of the gate voltage during the first switching event, and control the second switch such that the second switch is coupled to the second modulated supply voltage during a second Miller phase of the second transient interval of the gate voltage during the second switching event.

19. A method of driving a transistor between switching states in a power circuit, the method comprising: supplying a gate drive voltage at an output terminal of a gate driver integrated circuit (IC) in order to drive the transistor between switching states; supplying a first fixed supply voltage and a second fixed supply voltage to the gate driver IC; converting, by the gate driver IC, the first fixed supply voltage into a first modulated supply voltage; and selectively coupling, by the gate driver IC via a first switch, the first fixed supply voltage and the first modulated supply voltage to the output terminal of the gate driver IC in order to regulate the gate drive voltage.

20. The method of embodiment 19, further comprising: controlling the first switch such that the first switch is coupled to the first modulated supply voltage during a transient interval of the gate voltage during a first switching event of the transistor; and controlling the first switch such that the first switch is coupled to the first fixed supply voltage during a first static state of the gate voltage, the first static state being contiguous to the transient interval.

21. The method of embodiment 20, further comprising: controlling the first switch such that the first switch is coupled to the first modulated supply voltage during a Miller phase of the transient interval of the gate voltage during the first switching event.

22. The method of embodiment 21, further comprising: receiving, by the gate driver IC, a PWM control signal; driving, by the gate driver IC, the transistor between the switching states based on the PWM control signal; detecting, by the gate driver IC, a pulse edge of the PWM control signal; and controlling, by the gate driver IC, the first switch such that the first switch is coupled to the first modulated supply voltage in response to detecting the pulse edge.

23. The method of embodiment 19, further comprising: converting, by the gate driver IC, the second fixed supply voltage into a second modulated supply voltage; and selectively coupling, by the gate driver IC via a second switch, the second fixed supply voltage and the second modulated supply voltage to the output terminal of the gate driver IC in order to regulate the gate drive voltage.

24. The method of embodiment 23, further comprising: controlling the first switch such that the first switch is coupled to the first modulated supply voltage during a first transient interval of the gate voltage during a first switching event of the transistor; controlling the first switch such that the first switch is coupled to the first fixed supply voltage during a first static state of the gate voltage, the first static state being contiguous to the first transient interval; controlling the second switch such that the second switch is coupled to the second modulated supply voltage during a second transient interval of the gate voltage during a second switching event of the transistor; and controlling the second switch such that the second switch is coupled to the second fixed supply voltage during a second static state of the gate voltage, the second static state being contiguous to the second transient interval.

25. The method of embodiment 24, further comprising: controlling the first switch such that the first switch is coupled to the first modulated supply voltage during a first Miller phase of the first transient interval of the gate voltage during the first switching event; and controlling the second switch such that the second switch is coupled to the second modulated supply voltage during a second Miller phase of the second transient interval of the gate voltage during the second switching event.

26. A gate driver, comprising: a first terminal configured to receive a first fixed supply voltage; a second terminal configured to receive a second fixed supply voltage; an output terminal configured to provide a gate drive voltage in order to drive a transistor between switching states; a first voltage converter configured to receive the first fixed supply voltage and modulate an amplitude of the first fixed supply voltage to generate a first modulated supply voltage; and a first switch configured to selectively couple the first fixed supply voltage and the first modulated supply voltage to the output terminal in order to regulate the gate drive voltage.

27. The gate driver of embodiment 26, further comprising: a controller configured to control the first switch such that the first switch is coupled to the first modulated supply voltage during a transient interval of a gate voltage of the transistor during a first switching event of the transistor, and control the first switch such that the first switch is coupled to the first fixed supply voltage during a first static state of the gate voltage, the first static state being contiguous to the transient interval.

28. The gate driver of embodiment 27, wherein the controller is configured to control the first switch such that the first switch is coupled to the first modulated supply voltage during a Miller phase of the transient interval of the gate voltage during the first switching event.

29. The gate driver of embodiment 27, wherein: the controller is configured to receive a PWM control signal and drive the transistor between the switching states based on the PWM control signal, and the controller is configured to detect a pulse edge of the PWM control signal and control the first switch such that the first switch is coupled to the first modulated supply voltage in response to detecting the pulse edge.

30. The gate driver of embodiment 29, wherein: the controller comprises a timer, and the controller is configured to start the timer in response to detecting the pulse edge and control the first switch such that the first switch is coupled to the first fixed supply voltage in response to a predetermined time interval lapsing at the timer.

31. The gate driver of embodiment 29, wherein: the controller is configured to monitor the gate voltage and compare the monitored gate voltage to a threshold voltage value, and the controller is configured to control the first switch such that the first switch is coupled to the first fixed supply voltage in response to the monitored gate voltage exceeding the threshold voltage value.

32. The gate driver of embodiment 26, further comprising: a second voltage converter configured to receive the second fixed supply voltage and modulate an amplitude of the second fixed supply voltage to generate a second modulated supply voltage; and a second switch configured to selectively couple the second fixed supply voltage and the second modulated supply voltage to the output terminal of the gate driver IC in order to regulate the gate drive voltage.

33. The gate driver of embodiment 32, further comprising: a controller configured to: control the first switch such that the first switch is coupled to the first modulated supply voltage during a first transient interval of a gate voltage of the transistor during a first switching event of the transistor and coupled to the first fixed supply voltage during a first static state of the gate voltage, the first static state being contiguous to the first transient interval, and control the second switch such that the second switch is coupled to the second modulated supply voltage during a second transient interval of the gate voltage during a second switching event of the transistor and coupled to the second fixed supply voltage during a second static state of the gate voltage, the second static state being contiguous to the second transient interval.

34. The gate driver of embodiment 33, wherein the controller is configured to: control the first switch such that the first switch is coupled to the first modulated supply voltage during a first Miller phase of the first transient interval of the gate voltage during the first switching event, and control the second switch such that the second switch is coupled to the second modulated supply voltage during a second Miller phase of the second transient interval of the gate voltage during the second switching event.

While various embodiments have been described, it will be apparent to those of ordinary skill in the art that many more embodiments and implementations are possible within the scope of the disclosure. For example, there may be other ways to determine the slope of VGE. Accordingly, the invention is not to be restricted except in light of the attached claims and their equivalents. With regard to the various functions performed by the components or structures described above (assemblies, devices, circuits, systems, etc.), the terms (including a reference to a "means") used to describe such components are intended to correspond, unless otherwise indicated, to any component or structure that performs the specified function of the described component (i.e., that is functionally equivalent), even if not structurally equivalent to the disclosed structure that performs the function in the exemplary implementations of the invention illustrated herein.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or in the claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

The techniques described in this disclosure may be implemented, at least in part, in hardware, software, firmware, or any combination thereof. For example, various aspects of the described techniques may be implemented within one or more processors, including one or more microprocessors, central processing units (CPUs), analog-to-digital converters, digital signal processors (DSPs), application specific integrated circuits (ASICs), or any other equivalent integrated or discrete logic circuitry, as well as any combinations of such components.

The terms "processor" or "processing circuitry" may be used interchangeably, and may generally refer to any of the foregoing logic circuitry, alone or in combination with other logic circuitry, or any other equivalent circuitry suitable for implementation of the techniques described herein. In addition, two or more processing units described above (e.g., the correction factor unit, the gate control unit, and the comparator circuitry) may be combined into fewer processing units and may be incorporated into a single processor. However, each processing unit may have its own corresponding sub-processor or processing circuitry.

A control unit including hardware may also perform one or more of the techniques of this disclosure, and may also be comprised of a processor or suitable processing circuitry. Such hardware, software, and firmware may be implemented within the same device or within separate devices to support the various techniques described in this disclosure.

Although various exemplary embodiments have been disclosed, it will be apparent to those skilled in the art that various changes and modifications can be made which will achieve some of the advantages of the concepts disclosed herein without departing from the spirit and scope of the invention. It will be obvious to those reasonably skilled in the art that other components performing the same functions may be suitably substituted. It is to be understood that other embodiments may be utilized and structural or logical changes may be made without departing from the scope of the present invention. It should be mentioned that features explained with reference to a specific figure may be combined with features of other figures, even in those not explicitly mentioned. Such modifications to the general inventive concept are intended to be covered by the appended claims and their legal equivalents.

What is claimed is:

1. A gate driver circuit, comprising:
    a first power supply rail configured to provide a first fixed supply voltage;
    a second power supply rail configured to provide a second fixed supply voltage;
    a transistor comprising a gate terminal having a gate voltage;
    a gate driver integrated circuit (IC) supplied with the first fixed supply voltage and the second fixed supply voltage, the gate driver IC comprising an output terminal coupled to the gate terminal of the transistor and configured to provide a gate drive voltage at the output terminal in order to drive the transistor between switching states; and
    a gate resistor coupled between the output terminal of the gate driver IC and the gate terminal of the transistor, wherein the gate resistor defines a gate current based on the gate drive voltage and the gate voltage,
    wherein the gate driver IC further comprises:
        a first voltage converter configured to receive the first fixed supply voltage and modulate an amplitude of the first fixed supply voltage to generate a first modulated supply voltage; and
        a first switch configured to selectively couple the first fixed supply voltage and the first modulated supply voltage to the output terminal of the gate driver IC in order to regulate the gate drive voltage,
        wherein the first switch is configured to couple the first modulated supply voltage to the gate terminal of the transistor during a first switching event of the transistor during which the transistor transitions from a first state to a second state, and
        wherein the first switch is configured to couple the first fixed supply voltage to the gate terminal of the transistor during the second state of the transistor.

2. The gate driver circuit of claim 1, wherein the first switch is configured to selectively couple the first fixed supply voltage and the first modulated supply voltage to the output terminal of the gate driver IC in order to regulate the gate current.

3. The gate driver circuit of claim 1, wherein the gate driver IC further comprises:
    a controller configured to control the first switch such that the first switch is coupled to the first modulated supply voltage during a transient interval of the gate voltage during the first switching event of the transistor, and control the first switch such that the first switch is coupled to the first fixed supply voltage during a first static state of the gate voltage, the first static state being contiguous to the transient interval.

4. The gate driver circuit of claim 3, wherein the controller is configured to control the first switch such that the first switch is coupled to the first modulated supply voltage during a Miller phase of the transient interval of the gate voltage during the first switching event.

5. The gate driver circuit of claim 3, wherein:
    the controller is configured to receive a PWM control signal and drive the transistor between the switching states based on the PWM control signal, and
    the controller is configured to detect a pulse edge of the PWM control signal and control the first switch such that the first switch is coupled to the first modulated supply voltage in response to detecting the pulse edge.

6. The gate driver circuit of claim 5, wherein:
    the controller comprises a timer, and
    the controller is configured to start the timer in response to detecting the pulse edge and control the first switch such that the first switch is coupled to the first fixed supply voltage in response to a predetermined time interval lapsing at the timer.

7. The gate driver circuit of claim 5, wherein:
the controller is coupled to the gate terminal of the transistor and is configured to monitor the gate voltage and compare the monitored gate voltage to a threshold voltage value, and
the controller is configured to control the first switch such that the first switch is coupled to the first fixed supply voltage in response to the monitored gate voltage exceeding the threshold voltage value.

8. The gate driver circuit of claim 7, wherein the threshold voltage value is the first fixed supply voltage.

9. The gate driver circuit of claim 7, wherein the threshold voltage value has a magnitude less than a magnitude of the first fixed supply voltage.

10. The gate driver circuit of claim 3, wherein:
the first fixed supply voltage is a positive fixed supply voltage and the first modulated supply voltage is a modulated positive supply voltage, and
the first switching event is a turn-on switching event of the transistor.

11. The gate driver circuit of claim 3, wherein:
the first fixed supply voltage is a negative fixed supply voltage and the first modulated supply voltage is a modulated negative supply voltage, and
the first switching event is a turn-off switching event of the transistor.

12. The gate driver circuit of claim 1, wherein the first voltage converter is configured to receive a slew rate control (SRC) control signal from an external controller, and generate the first modulated supply voltage based on voltage amplitude information provided by the SRC control signal.

13. The gate driver circuit of claim 12, further comprising:
a sensor configured to measure a physical quality of the gate driver circuit and generate a measurement signal,
wherein the first voltage converter is configured to receive the measurement signal from the sensor and generate the first modulated supply voltage based on the voltage amplitude information provided by the SRC control signal and the measurement signal.

14. The gate driver circuit of claim 13, wherein the sensor is one of a temperature sensor configured to measure a temperature associated with the transistor, a voltage sensor configured to measure a load voltage corresponding to a load coupled to the transistor, or a current sensor configured to measure a load current corresponding to the load.

15. The gate driver circuit of claim 12, further comprising:
a sensor configured to measure a physical quality of the gate driver circuit and generate a measurement signal; and
an external controller configured to receive the measurement signal from the sensor, generate the voltage amplitude information based on the measurement signal, and transmit the SRC control signal, including the voltage amplitude information, to the first voltage converter.

16. The gate driver circuit of claim 1, wherein the transistor is a high-side transistor configured to drive a load current, wherein the first state is an off state and the second state is an on state.

17. The gate driver circuit of claim 1, wherein the transistor is a low-side transistor configured to drive a load current, wherein the first state is an on state and the second state is an off state.

18. The gate driver circuit of claim 1, wherein:
the gate driver IC further comprises a supply transistor coupled to and between the first switch and the output terminal along a first current path of the gate current, and
while the supply transistor is turned on, the first switch is configured to couple the first modulated supply voltage to the supply transistor during a first time interval and couple the first fixed supply voltage to the supply transistor during a second time interval.

19. A gate driver circuit, comprising:
a first power supply rail configured to provide a first fixed supply voltage;
a second power supply rail configured to provide a second fixed supply voltage;
a transistor comprising a gate terminal having a gate voltage;
a gate driver integrated circuit (IC) supplied with the first fixed supply voltage and the second fixed supply voltage, the gate driver IC comprising an output terminal coupled to the gate terminal of the transistor and configured to provide a gate drive voltage at the output terminal in order to drive the transistor between switching states; and
a gate resistor coupled between the output terminal of the gate driver IC and the gate terminal of the transistor, wherein the gate resistor defines a gate current based on the gate drive voltage and the gate voltage,
wherein the gate driver IC further comprises:
a first voltage converter configured to receive the first fixed supply voltage and modulate an amplitude of the first fixed supply voltage to generate a first modulated supply voltage;
a first switch configured to selectively couple the first fixed supply voltage and the first modulated supply voltage to the output terminal of the gate driver IC in order to regulate the gate drive voltage;
a second voltage converter configured to receive the second fixed supply voltage and modulate an amplitude of the second fixed supply voltage to generate a second modulated supply voltage; and
a second switch configured to selectively couple the second fixed supply voltage and the second modulated supply voltage to the output terminal of the gate driver IC in order to regulate the gate drive voltage.

20. The gate driver circuit of claim 19, wherein the gate driver IC further comprises:
a controller configured to:
control the first switch such that the first switch is coupled to the first modulated supply voltage during a first transient interval of the gate voltage during a first switching event of the transistor and coupled to the first fixed supply voltage during a first static state of the gate voltage, the first static state being contiguous to the first transient interval, and
control the second switch such that the second switch is coupled to the second modulated supply voltage during a second transient interval of the gate voltage during a second switching event of the transistor and coupled to the second fixed supply voltage during a second static state of the gate voltage, the second static state being contiguous to the second transient interval.

21. The gate driver circuit of claim 20, wherein the controller is configured to:
control the first switch such that the first switch is coupled to the first modulated supply voltage during a first Miller phase of the first transient interval of the gate voltage during the first switching event, and control the second switch such that the second switch is coupled to the second modulated supply voltage during a second Miller phase of the second transient interval of the gate voltage during the second switching event.

22. A method of driving a transistor between switching states in a power circuit, the method comprising:
supplying a gate drive voltage at an output terminal of a gate driver integrated circuit (IC) in order to drive the transistor between switching states;
supplying a first fixed supply voltage and a second fixed supply voltage to the gate driver IC;
converting, by the gate driver IC, the first fixed supply voltage into a first modulated supply voltage; and
selectively coupling, by the gate driver IC via a first switch, the first fixed supply voltage and the first modulated supply voltage to the output terminal of the gate driver IC in order to regulate the gate drive voltage,
wherein selectively coupling includes:
coupling the first modulated supply voltage to the gate terminal of the transistor during a first switching event of the transistor during which the transistor transitions from a first state to a second state, and
coupling the first fixed supply voltage to the gate terminal of the transistor during the second state of the transistor.

23. The method of claim 22, further comprising:
controlling the first switch such that the first switch is coupled to the first modulated supply voltage during a transient interval of the gate voltage during the first switching event of the transistor; and
controlling the first switch such that the first switch is coupled to the first fixed supply voltage during a first static state of the gate voltage, the first static state being contiguous to the transient interval.

24. The method of claim 23, further comprising:
controlling the first switch such that the first switch is coupled to the first modulated supply voltage during a Miller phase of the transient interval of the gate voltage during the first switching event.

25. The method of claim 24, further comprising:
receiving, by the gate driver IC, a PWM control signal;
driving, by the gate driver IC, the transistor between the switching states based on the PWM control signal;
detecting, by the gate driver IC, a pulse edge of the PWM control signal; and
controlling, by the gate driver IC, the first switch such that the first switch is coupled to the first modulated supply voltage in response to detecting the pulse edge.

26. A method of driving a transistor between switching states in a power circuit, the method comprising:
supplying a gate drive voltage at an output terminal of a gate driver integrated circuit (IC) in order to drive the transistor between switching states;
supplying a first fixed supply voltage and a second fixed supply voltage to the gate driver IC;
converting, by the gate driver IC, the first fixed supply voltage into a first modulated supply voltage;
selectively coupling, by the gate driver IC via a first switch, the first fixed supply voltage and the first modulated supply voltage to the output terminal of the gate driver IC in order to regulate the gate drive voltage;
converting, by the gate driver IC, the second fixed supply voltage into a second modulated supply voltage; and
selectively coupling, by the gate driver IC via a second switch, the second fixed supply voltage and the second modulated supply voltage to the output terminal of the gate driver IC in order to regulate the gate drive voltage.

27. The method of claim 26, further comprising:
controlling the first switch such that the first switch is coupled to the first modulated supply voltage during a first transient interval of the gate voltage during a first switching event of the transistor;
controlling the first switch such that the first switch is coupled to the first fixed supply voltage during a first static state of the gate voltage, the first static state being contiguous to the first transient interval;
controlling the second switch such that the second switch is coupled to the second modulated supply voltage during a second transient interval of the gate voltage during a second switching event of the transistor; and
controlling the second switch such that the second switch is coupled to the second fixed supply voltage during a second static state of the gate voltage, the second static state being contiguous to the second transient interval.

28. The method of claim 27, further comprising:
controlling the first switch such that the first switch is coupled to the first modulated supply voltage during a first Miller phase of the first transient interval of the gate voltage during the first switching event; and
controlling the second switch such that the second switch is coupled to the second modulated supply voltage during a second Miller phase of the second transient interval of the gate voltage during the second switching event.

* * * * *